United States Patent [19]

Tan

[11] Patent Number: 4,989,002
[45] Date of Patent: Jan. 29, 1991

[54] COMMON-MODE ERROR SELF-CALIBRATION CIRCUIT AND METHOD OF OPERATION

[75] Inventor: Khen-Sang Tan, Plano, Tex.

[73] Assignee: Texas Instruments Incorporated, Dallas, Tex.

[21] Appl. No.: 478,312

[22] Filed: Feb. 12, 1990

[51] Int. Cl.⁵ .......................................... H03M 1/10
[52] U.S. Cl. .................................. 341/120; 341/172
[58] Field of Search ............... 341/118, 120, 121, 172

[56] References Cited

U.S. PATENT DOCUMENTS

| | | | |
|---|---|---|---|
| 4,295,089 | 10/1981 | Cooperman | 341/118 |
| 4,399,426 | 8/1983 | Tan | 341/120 |
| 4,633,223 | 12/1986 | Senderowicz | 341/118 |
| 4,668,936 | 5/1987 | Newcomb et al. | 341/172 |
| 4,709,225 | 11/1987 | Welland et al. | 341/120 |
| 4,799,042 | 1/1989 | Confalonieri et al. | 341/118 |
| 4,803,562 | 2/1989 | Hester et al. | 341/172 |
| 4,831,381 | 5/1989 | Hester | 341/172 |
| 4,896,156 | 1/1990 | Garverick | 341/172 |

Primary Examiner—William M. Shoop, Jr.
Assistant Examiner—Marc S. Hoff
Attorney, Agent, or Firm—Stanton Braden; James T. Comfort; Douglas A. Sorensen

[57] ABSTRACT

There is disclosed a fully differential converter (10) having a very high common mode rejection ratio. The capacitive parasitics (CP) are accounted for by a strategic placement of error correction capacitances (20). The actual value of the capacitance is calculated from time to time by successively making comparative circuit operations and by adding and subtracting capacitance automatically under logic control (62) until the circuit is in near balance. The final value of the added capacitance for any given calculation set is stored in a memory (61). In this manner the circuit become self-calibrating and common mode rejection ratios over 90 db are possible.

23 Claims, 3 Drawing Sheets

FIG. 3

CONSIDER CAPACITORS C1 AND CP
INITIALLY THE VOLTAGES ON THESE CAPACITORS ARE:

① 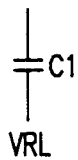   AND   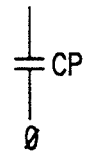

FIG. 4

② $VRM = \dfrac{VRH+VRL}{2}$

FINALLY THE VOLTAGE SHOULD BE:

③ 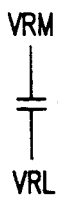   AND   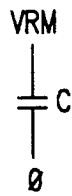

FIG. 5

THEREFORE:

IN ①    Q1 = (VRH−VCOM+VRL−VRL) C1+VCOM CP

③    Q2 = (VRM−VRL) C1+VRM CP

USING CHARGE CONSERVATION PRINCIPLE,

① = ③  (VRH−VCOM) C1+VCOM CP = (VRM−VRL) C1 +VRM CP

VRH C1 = (VRM+VRL) C1+VRM CP

C1 (VRH−VRM+VRL) =VRM CP

SINCE VRH + VRL = 2VRM AS SHOWN IN ②

∴ C1 (2VRM−VRM) = VRM CP

∴ C1 = CP

COMMON-MODE ERROR SELF-CALIBRATION CIRCUIT AND METHOD OF OPERATION

TECHNICAL FIELD OF THE INVENTION

This invention relates to a common-mode error correction circuit and method and more particularly to such a circuit for reducing the parasitic capacitance effect in converter circuits.

BACKGROUND OF THE INVENTION

There are many circuits where very precise measurements must be made in a short amount of time. One such circuit is the analog to digital A/D converter which is well known in the art. Fully differential analog-to-digital converters handle both the positive and the negative portions of the analog wave form and convert the analog signal into a digital word having a certain number of bits. Ideally, a fully differential A/D converter should have an infinite common mode rejection ratio (CMRR). However, due to practical limitations, such as the finite CMRR of the comparator, differing devices and parasitic capacitance, typical CMRR of an A/D converter is limited to about 50 db. A new topography is discussed in U.S. Pat. No. 4,803,462 of Hester and Dewit dated Feb. 6, 1989. The aforementioned application, which is hereby incorporated by reference herein, shows a circuit arrangement which increases the CMRR to the 70 db range.

Further study has revealed that to reduce the ratio even further the parasitic capacitance problem must be overcome. This problem is many fold in that the capacitance is ever changing and can be dependent upon circuit components, their aging, or even the humidity or temperature of the day. Thus, the target is a moving one.

Accordingly, there is a need in the art for a circuit arrangement which compensates for parasitic capacitance and which can do so even if such capacitance changes from time to time.

SUMMARY OF THE INVENTION

These objectives, as well as others, have been achieved by a system and method of operation in which a compensating capacitance is added by a correction circuit to the input of a comparator. This compensating capacitance is calculated to be a value which eliminates the effect of the parasitic capacitance by cancelling the parasitic capacitance effect at the input to the comparator.

A circuit and method are provided to derive the exact value of the added capacitance so as to tune the capacitance to the actual circuit parameters at any period of time. In this manner, an initial calibration can be made to account for circuit component differences and then subsequent adjustments can be made to take into account changed circuit values due to aging and other factors.

The algorithm uses an array of binary weighted capacitors which are controlled by a data register, which in turn is controlled by a logic circuit operating in an iterative fashion. To begin the calibration of the correction circuit, a value is selected for the capacitance value and this value is added to the compensation circuit. Then two A/D conversions are made of known signals. First, both inputs to the converter have placed on them the low reference voltage and a digital output word is derived. Then, both inputs have placed on them the reference high voltage and a second digital output word is derived. These two words, in the ideal world (and when the added capacitance is right) should be identical. After the first iteration of the automatic correction arrangement, the words will seldom be identical and thus some correction of the added capacitance is in order.

Based upon which of the derived digital words was highest, a determination is made as to whether to add or subtract capacitance from the compensation circuit. This addition (or subtraction) is made and the same two reference signals are again used to derive a pair of digital words. These words are again compared to determine whether to increase or decrease the added capacitance. This process continues until no further correction is necessary.

Accordingly, it is one technical advantage of this invention to establish a circuit and method of operation which allows for the effective neutralization of the parasitic capacitance problem in comparator circuits.

It is a further technical advantage to arrange such a circuit and method such that the amount of added compensating capacitance is self-calibrating on a periodic basis.

BRIEF DESCRIPTION OF THE DRAWINGS

The foregoing objects, features and technical advantages, as well as others, of the invention will be more apparent from the following description of the drawings in which:

FIGS. 3-5 show voltage relationships with respect to the parasitic capacitance.

DETAILED DESCRIPTION OF THE INVENTION

Figure 1:
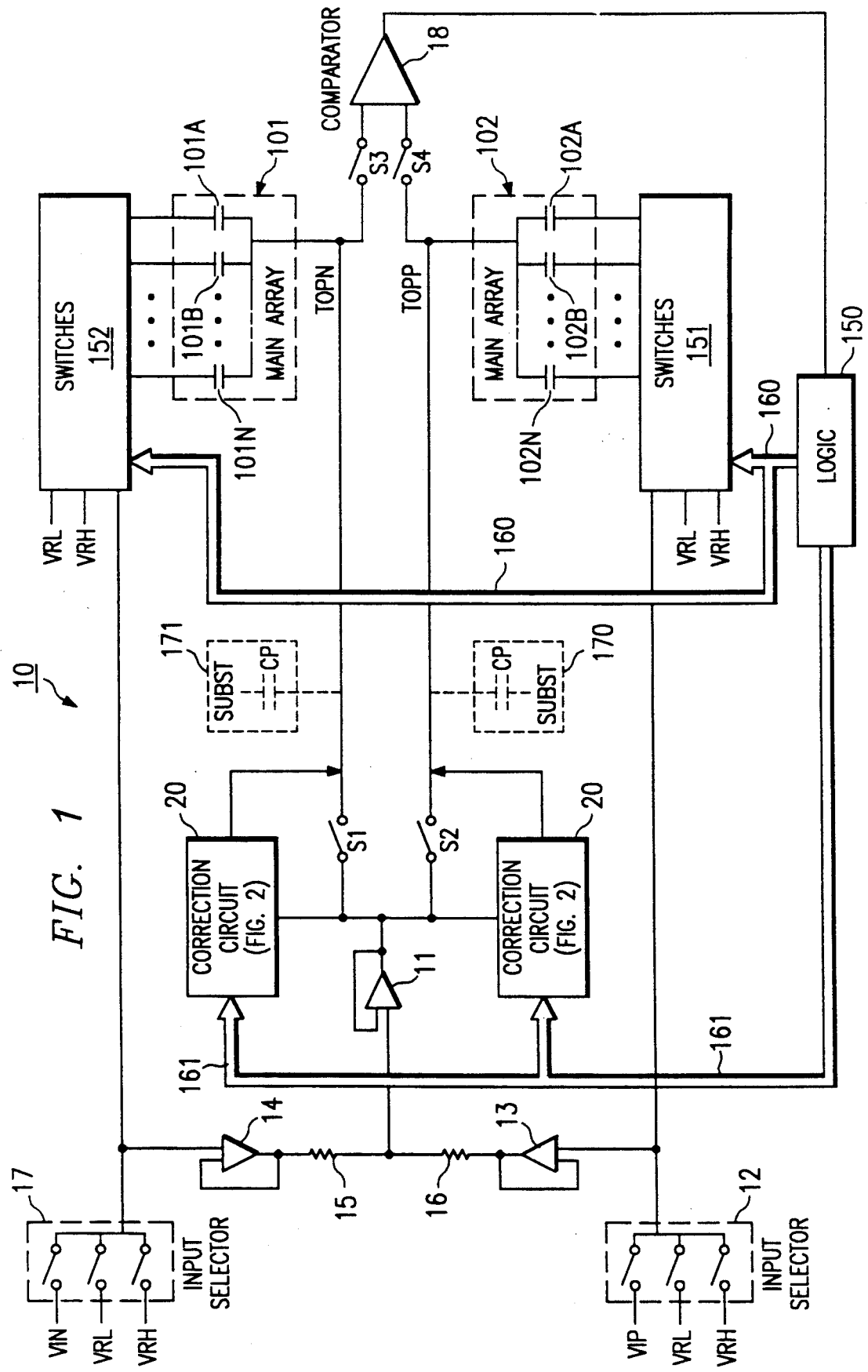
FIG. 1 is an illustrative embodiment of the analog to digital converter showing the correction circuit.

Before beginning a discussion of the correction system, it might be helpful to understand how an analog to digital converter circuit operates without the correction circuit. Thus, as shown in FIG. 1, there is what we call a fully differential analog to digital converter, shown generally as 10. The input signal at VIP is a positive signal and the input signal at VIN is a negative signal. In the sampling cycle, these input signals are first sampled onto the main capacitor arrays 102 and 103 through switches 151 and 152, respectively. During the sampling interval, the common mode signal of the input signals are derived through buffers 13 and 14, and through resistors 15 and 16 and buffer 11. This common mode signal is sampled onto the top plate of the main capacitor arrays 102 and 103, while the differential signal is switched onto the bottom plate of the capacitor array. For our purposes, the top plate of capacitor array 102 is connected to lead TOPP while the bottom plate is connected to switches 151. The same is true for capacitor array 101. One example of an analog-to-digital converter is shown in copending, concurrently filed patent application of Sami Kiriaki and Khen-Sang Tan, Serial No. 07/478,596, which application is hereby incorporated by reference herein.

Digressing momentarily, main capacitor array 102 consists of a series of capacitors usually weighted in a binary fashion so that the capacitor with the highest capacitance is said to have the most weight and is considered to be the most significant bit. At the beginning of the conversion cycle, all of the capacitors in each array are tied to low reference voltage VRL. When the most significant bit capacitor is to be utilized, that capacitor is switched to high reference voltage VRH while the other capacitors remain switched to VRL. This occurs in switches 151 for the positive side of the analog input signal while switches 152 perform the same function with respect to the negative side of the analog signal, except that the VRH and VRL switched operations for the negative side of the signal is reversed.

One A/D converter is shown in U.S. Pat. No. 4,803,462 dated Feb. 7, 1989, which patent is incorporated by reference herein. Comparator 18, under control of switches 54 and 53, then compares the voltage TOPP to the voltage TOPN and provides an output 1 or 0 depending upon which is the highest. Logic circuit 150 stores the information from comparator 18. At the conclusion of the testing of the most significant bit, logic 150 then controls the next significant bit in both switches 151 and 152 such that in switch 151 the VRH signal is applied to the second most significant bit, while in switches 152, the VRL signal is applied to the next significant bit. And, again, the output of the switches is compared via comparator 18, and a new bit 1 or 0 is stored in logic 150. This is the second bit of the digital equivalent of the analog signal. This procedure continues until all of the bits of the digital word have been generated. This can be a four-bit word or a ten-bit word depending upon the number of bits desired for any digital version of an analog signal.

Problems occur, however, in that the comparator operation just described assumes a perfect main capacitor array 102 and 101 with no stray or parasitic capacitance existing. However, in reality, there is parasitic capacitance which is represented by capacitor CP shown in phantom blocks 170 and 171. This parasitic capacitance is represented with reference to the substrate (subst) which is internal to the capacitance set. The correction circuit of this invention is designed to correct for the common mode error of the analog to digital converter circuit as well as remove the parasitic capacitance factor.

Again, digressing momentarily, it perhaps might be helpful to understand what is meant by common mode error. Normally, as discussed above, an analog to digital (A/D) converter resolves a differential signal (VIP minus VIN) to provide a digital word. What may happen, however, is that the signal may be elevated from ground a certain amount. If both the VIP and VIN signals are offset the same amount, the output of the digital converter should still be zero. However, in most instances, such is not the case because if there is a DC common mode signal sitting on an input, then the A/D converter will generate some digital code which is in error. This is what is called common mode error and arises because the A/D converter cannot distinguish common mode signals from differential signals.

This invention allows for the suppression of the sensitivity of the converter to the common mode signal. This is an important feature in the differential A/D converter. One reason for common mode error is that stray (parasitic) capacitance CP is resident on the top place of main array 102 (101). This then causes a signal on leads TOPP and TOPN. This stray capacitance signal will mix with the sampled signal at the top plate of the capacitor array and the comparator will make wrong decisions yielding inaccurate ones or zeroes in the output digital word. It is thus very important to either minimize the parasitic capacitance or cancel it entirely. Normally in a silicon IC design, the parasitic capacitance cannot be completely eliminated so it is important to have a correction circuit that is able to eliminate the parasitic effects.

Figure 2:
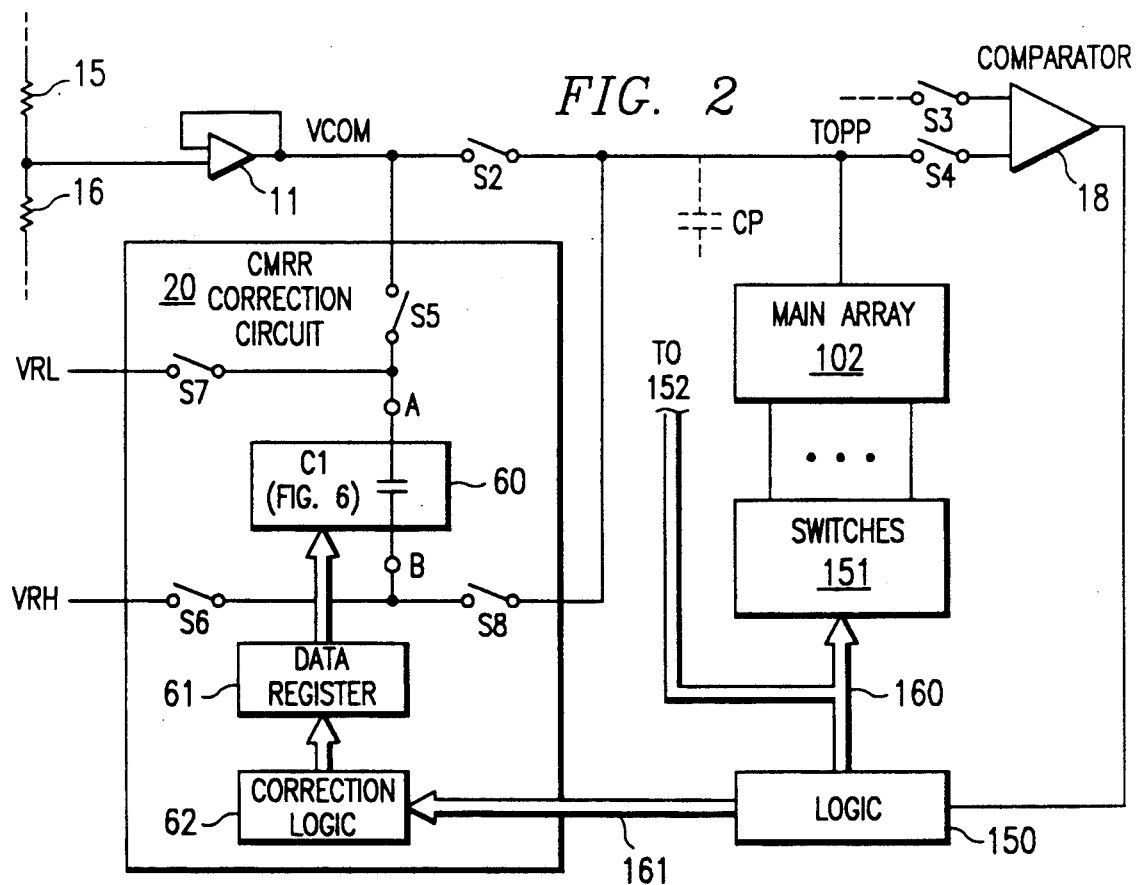
FIG. 2 is a more detailed view of the correction circuit and the, control thereof.

Turning now to FIG. 2, we will assume that there can be one capacitor C1, shown in box 60 which can be added to the circuit in the manner shown which will eliminate the effect of the parasitic capacitance CP. The proof of this statement is shown in FIGS. 3, 4 and 5 where it can be shown that if C1 is exactly equal to CP, then the effect of the parasitic capacitance can be completely eliminated. First during the sampling phase, when the common mode voltage is sampled to the top plate of the main capacitor array 102 (Switch S2 closed) the parasitic capacitor will have the common mode signal across it. During this sampling phase, the S5 switch is closed so that the common mode signal will charge the top layer of the C1 capacitor (Box 60), while the bottom plate of capacitor C1 is charged to reference high voltage (VRH) by closing switch S6. As soon as the sampling phase is over, the S2, S5 and S6 switches are opened and switch S7 is closed so that the top layer of capacitor C1 is charged to the reference low voltage (VRL). Switch S8 is then closed so that the bottom plate of capacitor C1 is connected back to the top layer of main capacitor array 102 which is lead TOPP.

By this procedure, essentially what we have is that the charge stored on capacitor C1 is equivalent to what is shown in FIG. 3, where the bottom of capacitor C1 is reference low (VRL) and the top of capacitor C1 is reference high (VRH) minus VCOM plus reference low (VRL). Also, the parasitic capacitor at this time is storing the VCOM on it.

After capacitor C1 is connected back to the TOPP node (via switch S8), the two capacitors, C1, CP, share the charge together. We assume this voltage to be some value VRM which is VRH+VRL divided by 2 as shown in equation two of FIG. 4. This is derived by defining VRM as the mid point voltage. That is, the voltage at which the top plate of the capacitor array TOPP (TOPN) will arrive at the end of the A/D conversion. This value typically is about 2.5 volts or the reference high (VRH) plus the reference low (VRL) divided by two.

As shown in FIG. 5, we know that the charge Q1 (which is the charge on capacitor C1) is shown in equation one. The charge, Q2 on parasitic capacitor CP is shown in equation three. Since these charges must be equal, then equation one equals equation three and we can derive and prove (as shown in FIG. 5) that for this to occur C1 must equal CP. This means that if we can make C1 exactly equal to CP, we are able to cancel the parasitic capacitance effect.

Since we now know that if capacitor C1 is constructed to be equal to parasitic capacitor CP, then the common mode error will be essentially eliminated. Now the problem is to determine what the value is for capacitor C1. However, this value can change from time to time depending upon the parameters of the circuit. Initially this would depend upon the selection of the various components of the circuit. This value, however, is affected by temperature, component change and other factors, so a mechanism must be present for automatically adjusting the value of capacitor C1 for the changing value of capacitor CP.

Figure 6:
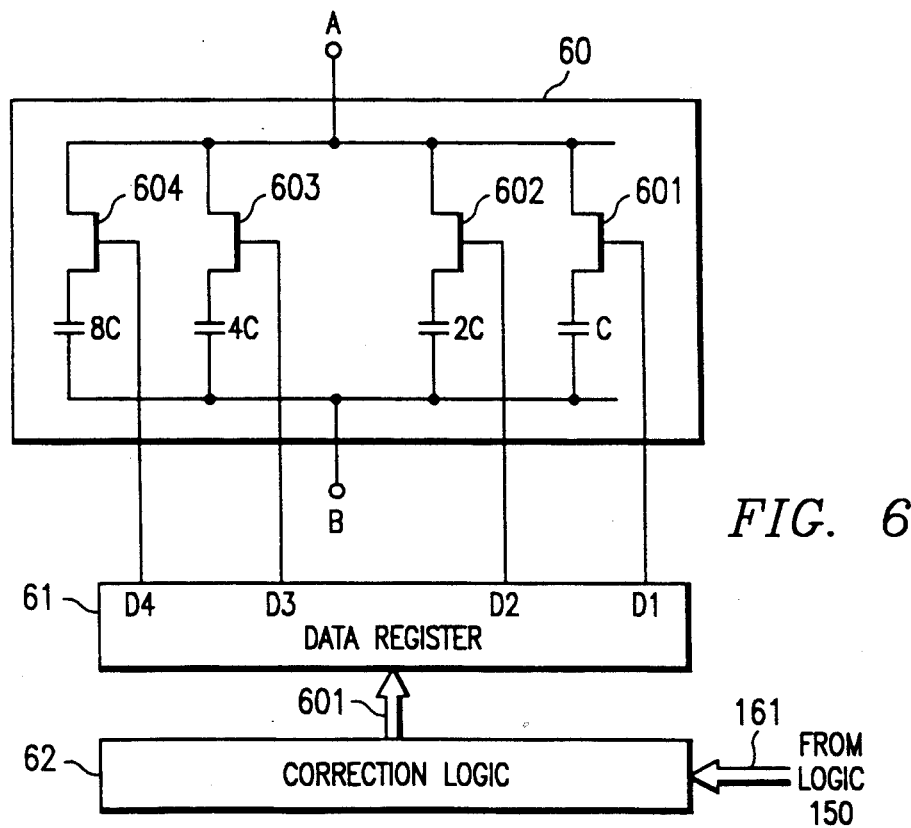
FIG. 6 shows a detailed circuit for controlling the switch capacitance.

FIG. 6 is an arrangement for constructing a circuit 60 to achieve the automatic selection of the value for capacitor C1. Basically, circuit 60 can be constructed as an array of many capacitors, C, 2C, 4C, 8C, with the capacitors binary weighted. By enabling switches 601-604 to connect capacitors C-8C, respectively, to terminal B, we can establish any desired value of capacitance. For even more accuracy, the capacitors can overlap in value to account for tolerances of the capacitors.

The data bits D1-D4 of data register 61 control the switches 601-604 and thus control the amount of capacitance which is added between terminal A and B. Thus, a 1 in bit D4 turns on switch 604, which in turn connects capacitor 8C to the A output of box 60. Likewise a 1 in bit D2 would, via switch 602, turn on the 2C capacitor, accordingly, if the binary word in data register 61 were, for example, to be 1,0,1,0, then capacitors 8C and 2C would be in parallel across points A and B of box 60.

To begin the algorithm for automatically determining which value of capacitance should be added, we establish the binary word 0,0,0,0 in data register 61. This has the effect of adding no capacitance to the circuit and thus allows a test to determine whether capacitance is necessary for correction purposes and if so, how much capacitance should be added. This same procedure is mirrored in correction circuit 20 (FIG. 1) for the negative signals. Thus, for both the positive analog signal and the negative analog signal, we have tentatively established a data word in the respective registers 0,0,0,0. To perform the test, and with reference to FIG. 1, both input selectors 12 and 17 are set to VRL (reference low), and the analog to digital conversion is performed. The output bits from comparator 18 is recorded.

Next, input selectors 12 and 17 are set to VRH (reference high), and another digital to analog conversion is recorded. Since in both cases the differential voltage is zero (VRH or VRL on both inputs), only the common mode voltage is different. If the common mode voltage, and the error associated therewith, were zero, the two recorded conversions would be identical. Usually this is not the case. To adjust C1 we observe the relative values of the two derived A/D conversions. If the second digital word (comparisons of VRH) is higher than the first digital word (comparisons of VRL), then we know that we must add some capacitance correction. If that is the case, the digital word is changed, then bit D4 is set to 1,0,0,0 thereby switching in capacitor C8. The test is repeated to determine if more or less capacitance is required.

The VRL,s are again compared as are the VRH,s and the outputs recorded and compared. Based on this information, logic circuit 62 (FIG. 6) decides if bit D4 is too much or too little. If bit D4 added too much capacitance (C8) then that bit is set to zero and the next bit, D3 is set to one. This turns on capacitor C4. In such a situation, the new word then would be 0100. If bit D4 (capacitance C8) is not enough, then the new word would be 1100. In either event, the same procedure is followed until a digital code is arrived at that corresponds to the desired C1 capacitor value.

When very close resolutions are necessary, more data bits, and thus more capacitance values, are used. The number of interactions, of course, go up, but the accuracy is increased. Logic circuit 62 can be set to readjust the capacitance values at start up, on demand from an external signal, in response to a timer, on every new input value, or otherwise, all depending upon the desired application. The routine for setting the data bits in register 61 can be many algorithms and particularly can be stepping sequentially from an arbitrary starting point. Because of the automatic self-adjusting nature of this circuit, it can be manufactured and used without pre-calibration. This self-calibration is applicable to correct for all common mode error sources (not limited to parasitic capacitance effect only) due to the general system level calibration method.

Although the present invention has been described in detail, it should be understood that various changes, substitutions, and alterations can be made herein without departing from the spirit and scope of the invention as defined by the appended claims. It should also be clear that while the circuit is dealing with capacitance, any form of reactance can be corrected in order to improve the accuracy of analog digital converters or any other type of circuit which compares voltages or signals one to another.

It should also be understood that the use of registers to control the switched capacitance values is but one illustrative embodiment and many other embodiments can be utilized both internal and external to control the addition of selectable reactance to the circuit.

It should also be understood that while the self-correction circuit has been shown in conjunction with an old converter it can be used to correct common mode error of the entire circuit or system without regard to where the source of the error lies.

In addition, this circuit will operate with one of the analog inputs fixed to zero or to a fixed voltage. In this case one of the levels is fixed and the other changing over time. One of the reference levels also can be fixed to ground if desired.

What is claimed is:

1. A circuit for removing parasitic capacitance from a system, wherein an input analog signal is referenced between first and second reference levels and wherein a positive analog signal is applied to a first input of a comparator and wherein a negative analog signal is applied to a second input of the comparator, said circuit comprising:

circuitry for applying said first reference level to said first and second inputs so as to obtain first comparisons of the magnitudes of the common mode error of said first reference;

circuitry for applying said second reference level to said first and second inputs so as to obtain a second comparisons of the magnitudes of the common mode error of said second reference;

circuitry responsive to said first and second comparisons for generating control signals dependent upon said first and second comparisons; and capacitance control circuitry for adding selected capacitance values to said system.

2. The circuit set forth in claim 1 wherein said capacitance control circuit includes:

switches operative from instructions for selecting said capacitance values; and circuitry for connecting said first and said second reference levels to said system via said capacitance values.

3. The circuit set forth in claim 2 wherein said instructions are binary coded bits, and wherein said capacitance control circuit further includes:

a data register for storing said data bits of said instructions.

4. The circuit set forth in claim 3 wherein said capacitance control circuit further includes:
circuitry for generating said bits for storage in said data register from said generated signals.

5. A circuit for removing stray reactance from a converter circuit which converts signals from one form to another, wherein the signals are referenced between first and second reference levels and wherein a first signal to be converted is applied to a first input of the converter and wherein a second signal to be converted is applied to a second input of the converter, said circuit comprising:
circuitry for applying said first reference level to said first and second inputs so as to obtain first comparisons of the magnitudes of the common mode error of said first reference;
circuitry for applying said second reference level to said first and second inputs so as to obtain second comparisons of the magnitudes of the common mode error of said second reference;
circuitry responsive to said first and second comparisons for generating control signals dependent upon said first and second comparisons;
reactance control circuitry for adding selected reactance values to said converter in conjunction with said first and second reference levels; and
circuitry responsive to said generated signals for selecting said reactance value to be added to said converter.

6. The circuit set forth in claim 5 wherein said reactance control circuit includes:
switches operative from instructions for selecting said reactance values; and
circuitry for connecting said first and said second reference levels to said converter circuit via said reactance values.

7. The circuit set forth in claim 6 wherein said instructions are binary coded bits, and wherein said reactance control circuit further includes:
a data register for storing said data bits of said instructions.

8. The circuit set forth in claim 7 wherein said reactance control circuit further includes:
circuitry for generating said bits for storage in said data register from said generated signals.

9. The method of removing parasitic capacitance from a system, wherein an input analog signal is referenced between first and second reference levels and wherein a positive analog signal is applied to a first input of a comparator and wherein a negative analog signal is applied to a second input of the comparator, said method comprising the steps of:
applying said first reference level to said first and second inputs so as to obtain a first comparison of the magnitudes of the common mode error of said first reference;
applying said second reference level to said first and second inputs so as to obtain a second comparison of the magnitudes of the common mode error of said second reference;
generating control signals dependent upon said first and second comparisons; and
selecting capacitance values to add to said system.

10. The method set forth in claim 9 wherein said capacitance control method includes the step of:
selecting said capacitance values in accordance with provided instructions.

11. The method set forth in claim 10 wherein said instructions are binary coded bits, and wherein said capacitance control method further includes the step of:
storing said data bits of said instructions in a data register.

12. The method set forth in claim 11 wherein said capacitance control method further includes the step of:
generating said storage bits from said generated signals.

13. The method set forth in claim 12 wherein said first level applying step, said second level applying step and said generating step are iteratively performed, with the number of iterations controlled by the number of bits in said data register.

14. A differential analog-to-digital converter, wherein the analog signal is referenced between first and second reference levels, said converter comprising:
a first input for accepting the positive analog signal;
a second input for accepting the negative analog signal;
circuitry for applying said first reference level to said first and second inputs so as to obtain a first comparison of the magnitudes of the common error;
circuitry for applying said second reference level to said first and second inputs so as to obtain a second comparison of the magnitudes common mode error;
circuitry responsive to said first and second comparisons for generating signals dependent upon said first and second comparisons; and
reactance control circuitry for adding selected reactance values to said converter.

15. The circuit set forth in claim 14 wherein said reactance control circuit includes:
switches operative from instructions for selecting said reactance values; and
circuitry for connecting said first and said second reference levels to said converter circuit through said reactance values.

16. The circuit set forth in claim 15 wherein said instructions are binary coded bits, and wherein said reactance control circuit further includes:
a data register for storing said data bits of said instructions.

17. The circuit set forth in claim 16 wherein said reactance control circuit further includes:
circuitry for generating said bits for storage in said data register from said generated signals.

18. The circuit set forth in claim 14 wherein said converter includes:
circuitry for removing any common mode signals from said analog signal.

19. The method of operating a differential analog-to-digital converter, wherein the analog signal is referenced between first and second reference levels, said method comprising the steps of:
accepting the positive analog signal;
accepting the negative analog signal;
applying said first reference level to said first and second inputs so as to obtain a first comparison of the magnitudes of the common mode error;
applying said second reference level to said first and second inputs so as to obtain a second comparison of the magnitudes of the common mode error;
generating signals dependent upon said first and second comparisons; and adding selected reactance values to said converter.

20. The method set forth in claim 19 wherein said reactance adding step includes the steps of:
   operating switches for selecting said reactance values; and
   connecting said first and said second reference levels to said converter circuit through said selected reactance values.

21. The method set forth in claim 20 wherein said comparisons are performed by a dual input comparator.

22. The method set forth in claim 19 wherein said reactance adding step is performed by two separate identical operations working on the positive and negative analog signals, respectively, and wherein each is connected to a separate one of said comparator inputs.

23. The method set forth in claim 19 wherein each of said inputs to said comparator has associated therewith a switched capacitance array for developing the binary equivalent of the analog signal.

* * * * *